US007948004B2

(12) United States Patent
Suzuki

(10) Patent No.: US 7,948,004 B2
(45) Date of Patent: May 24, 2011

(54) LIGHT SOURCE HEAD AND IMAGE FORMING APPARATUS

(75) Inventor: Teiichi Suzuki, Kanagawa (JP)

(73) Assignee: Fuji Xerox Co., Ltd., Tokyo (JP)

(*) Notice: Subject to any disclaimer, the term of this patent is extended or adjusted under 35 U.S.C. 154(b) by 246 days.

(21) Appl. No.: 12/271,152

(22) Filed: Nov. 14, 2008

(65) Prior Publication Data

US 2009/0297223 A1 Dec. 3, 2009

(30) Foreign Application Priority Data

May 30, 2008 (JP) ................................ 2008-142776

(51) Int. Cl.
*H01L 31/04* (2006.01)

(52) U.S. Cl. ................ 257/116; 257/918; 257/E33.047; 399/220

(58) Field of Classification Search .................. 257/116, 257/413, 918, E33.047; 399/220
See application file for complete search history.

(56) References Cited

U.S. PATENT DOCUMENTS

| | | | | |
|---|---|---|---|---|
| 5,434,434 | A | 7/1995 | Kasahara et al. | |
| 5,451,977 | A | 9/1995 | Kusuda et al. | |
| 5,677,552 | A * | 10/1997 | Ogura | 257/113 |
| 5,814,841 | A * | 9/1998 | Kusuda et al. | 257/113 |
| 6,180,960 | B1 | 1/2001 | Kusuda et al. | |
| 6,614,055 | B1 * | 9/2003 | Kusuda et al. | 257/79 |
| 6,858,368 | B2 * | 2/2005 | Azuma et al. | 430/124.4 |
| 2002/0121647 | A1 * | 9/2002 | Taylor | 257/192 |
| 2005/0089788 | A1 * | 4/2005 | Nukada et al. | 430/125 |
| 2006/0119669 | A1 * | 6/2006 | Sharma et al. | 347/82 |
| 2007/0057268 | A1 | 3/2007 | Hamanaka et al. | |

FOREIGN PATENT DOCUMENTS

| | | | |
|---|---|---|---|
| JP | 1238962 | A | 9/1989 |
| JP | 2014584 | A | 1/1990 |
| JP | 2092650 | A | 4/1990 |
| JP | 2212170 | A | 8/1990 |
| JP | 4340288 | A | 11/1992 |
| JP | 5077486 | A | 3/1993 |
| JP | 5088062 | A | 4/1993 |
| JP | 5235473 | A | 9/1993 |
| JP | 05257173 | A | 10/1993 |
| JP | 8264838 | A | 10/1996 |
| JP | 9092885 | A | 4/1997 |
| JP | 09283792 | A | 10/1997 |
| JP | 9283794 | A | 10/1997 |
| JP | 2001189526 | A | 7/2001 |
| JP | 2005039195 | A | 2/2005 |

OTHER PUBLICATIONS

Japanese Office Action dated Feb. 2, 2010 for Japanese Patent Application No. 2008-142776 and English-language translation.
Notice of Reasons for Rejection in corresponding application JP 2008/142776, dated Aug. 31, 2010.

* cited by examiner

*Primary Examiner* — Allan R Wilson
(74) *Attorney, Agent, or Firm* — Sughrue Mion, PLLC

(57) ABSTRACT

A self-scanning light source head comprising: a substrate, surface emitting semiconductor lasers arranged in an array on the substrate, and at least one thyristor disposed on the substrate and serving as a switching element selectively turning ON and OFF light emission of the surface emitting semiconductor lasers, and an image forming apparatus using the same are provided.

3 Claims, 3 Drawing Sheets

LIGHT SOURCE HEAD AND IMAGE FORMING APPARATUS

CROSS-REFERENCE TO RELATED APPLICATION

This application is based on and claims priority under 35 USC 119 from Japanese Patent Application No. 2008-142776 filed May 30, 2008.

BACKGROUND

1. Technical Field

The present invention relates to a light source head and an image forming apparatus using the same.

2. Related Art

In recent years, an LED printer head in which LEDs (light emitting diodes) are arranged in an array has been known as a light source head of an image forming apparatus, such as a printer, a copying machine, or a facsimile machine.

In contrast, a self-scanning LED printer head is also known as a light source head. In the self-scanning LED printer head, an LED and a thyristor are simultaneously produced on a GaAs substrate for example, and lighting of the LED is controlled by the thyristor simultaneously produced in the vicinity of the LED. Therefore, the self-scanning LED printer head has a merit in that the number of wire bondings sharply becomes small as compared with the lighting control of an LED using an IC.

SUMMARY

According to an aspect of the invention, there is provided a self-scanning light source head comprising: a substrate, surface emitting semiconductor lasers arranged in an array on the substrate, and at least one thyristor disposed on the substrate and serving as a switching element selectively turning ON and OFF light emission of the surface emitting semiconductor lasers.

BRIEF DESCRIPTION OF THE DRAWINGS

Exemplary embodiment(s) of the present invention will be described in detail based on the following figures, wherein.

DETAILED DESCRIPTION

Figure 1:
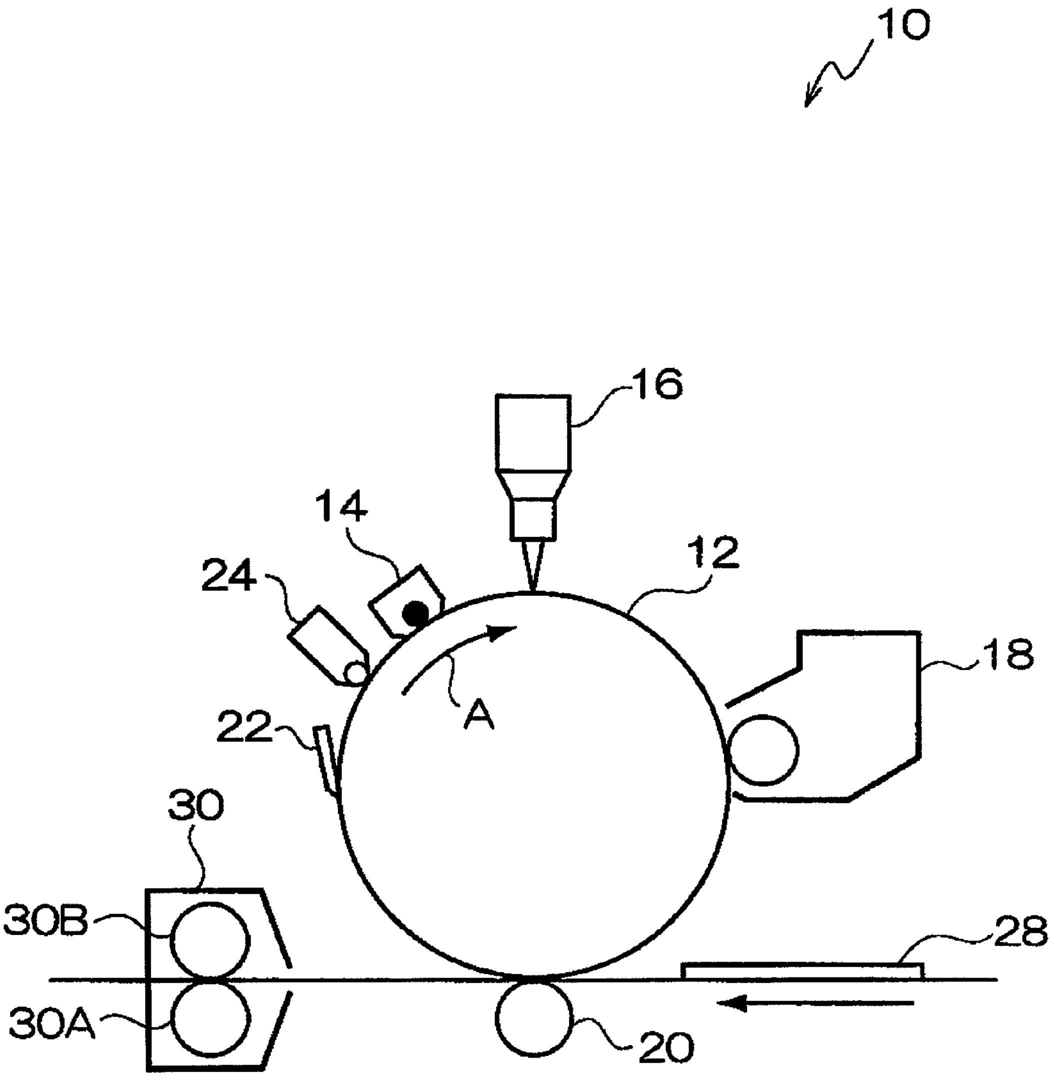
FIG. 1 is a schematic configuration view illustrating an image forming apparatus of the exemplary embodiments.

Exemplary embodiments of the invention are described in detail hereinafter. More specifically, a first exemplary embodiment of the invention is a self-scanning light source head comprising: a substrate, surface emitting semiconductor lasers arranged in an array on the substrate, and at least one thyristor disposed on the substrate and serving as a switching element selectively turning ON and OFF light emission of the surface emitting semiconductor lasers.

A second exemplary embodiment of the invention is the self-scanning light source head according to the first exemplary embodiment, having the thyristor in the element structure of the surface emitting semiconductor laser.

A third exemplary embodiment of the invention is the self-scanning light source head according to the second exemplary embodiment, wherein a dielectric multilayer film is disposed on a semiconductor multilayer film of a top layer of a light emitting surface of the surface emitting semiconductor laser.

A fourth exemplary embodiment of the invention is the self-scanning light source head according to anyone of from the first to the third exemplary embodiments, wherein the surface emitting semiconductor laser has a configuration such that a lower semiconductor multilayer film reflecting layer, a semiconductor active layer, and an upper semiconductor multilayer film reflecting layer forming a resonator with the lower multilayer film reflecting layer are successively laminated on a semiconductor substrate.

A fifth exemplary embodiment of the invention is the self-scanning light source head according to the fourth exemplary embodiment, wherein the lower semiconductor multilayer film reflecting layer contains a combination of a plurality of configurations of n-configuration and p-configuration semiconductor multilayer film reflecting layers.

A sixth exemplary embodiment of the invention is the self-scanning light source head according to the fifth exemplary embodiment, wherein an end of a portion of a top layer of the combination of the plurality of configurations of n-configuration and p-configuration semiconductor multilayer film reflecting layers is reduced in the film thickness as compared with other portions; at least one upper layer is laminated at a portion other than the film thickness-reduced portion; and a gate electrode is disposed at the film thickness-reduced portion.

A seventh exemplary embodiment of the invention is an image forming apparatus comprising: an electrophotographic photoreceptor, a charging unit that charges the surface of the electrophotographic photoreceptor, an exposure unit that exposes the surface of the electrophotographic photoreceptor charged by the charging unit to form an electrostatic latent image on the surface of the electrophotographic photoreceptor, a development unit that develops the electrostatic latent image by a developer in order to form a toner image, a transfer unit that transfers the toner image to a recording medium, and a fixing unit that fixes the toner image transferred to the recording medium, the exposure unit being equipped with the light source head according to anyone of from the first to the sixth exemplary embodiments.

Hereinafter, exemplary embodiments of the present invention will be described in detail with reference to the drawings. The same reference numerals are denoted to members having substantially the same functions throughout the drawings, and the same descriptions thereof are sometimes omitted.

Figure 2:
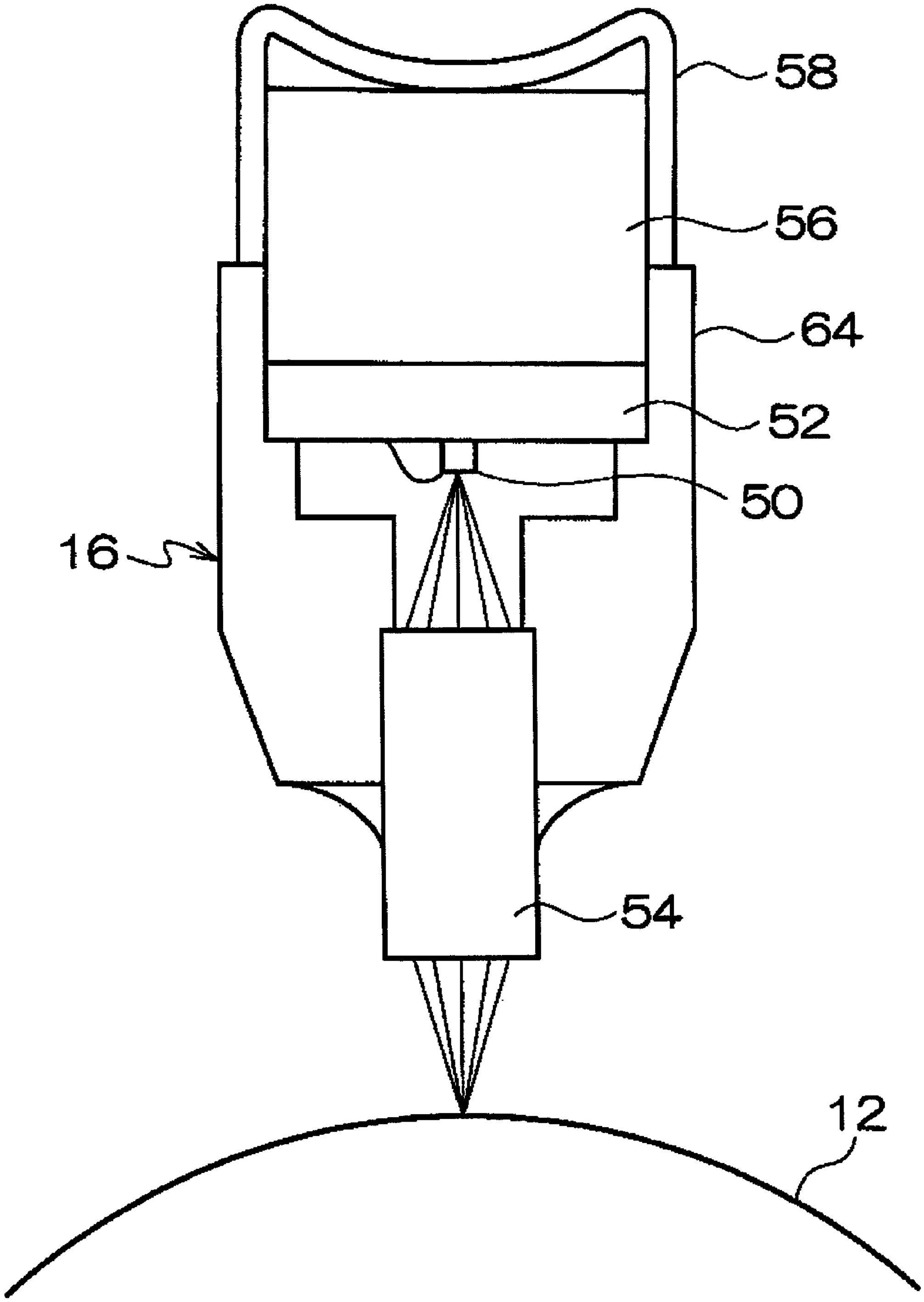
FIG. 2 is a cross-sectional schematic configuration diagram illustrating the internal configuration of a printer head (light source head) according to an exemplary embodiment.
Figure 3:
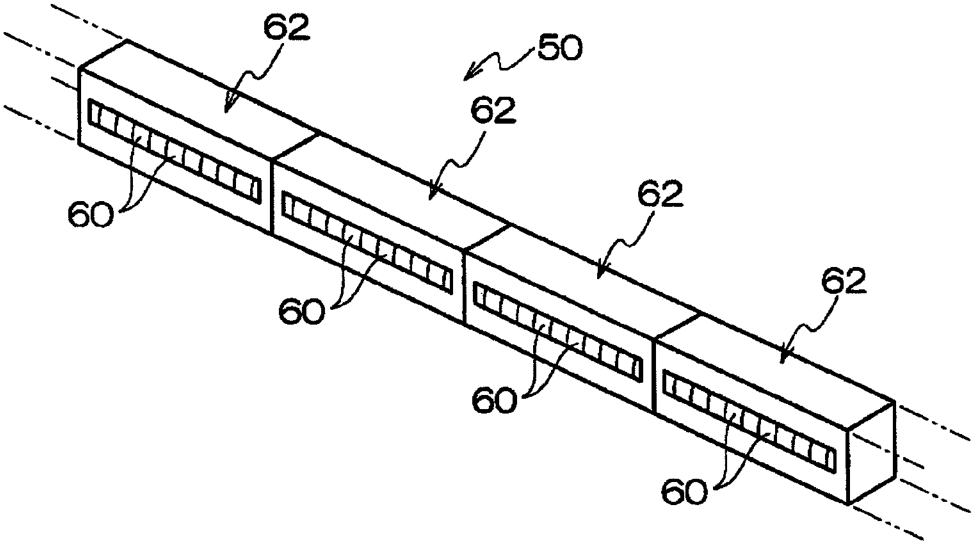
FIG. 3 is a perspective view illustrating the appearance of a VCSEL array according to an exemplary embodiment.
Figure 4:
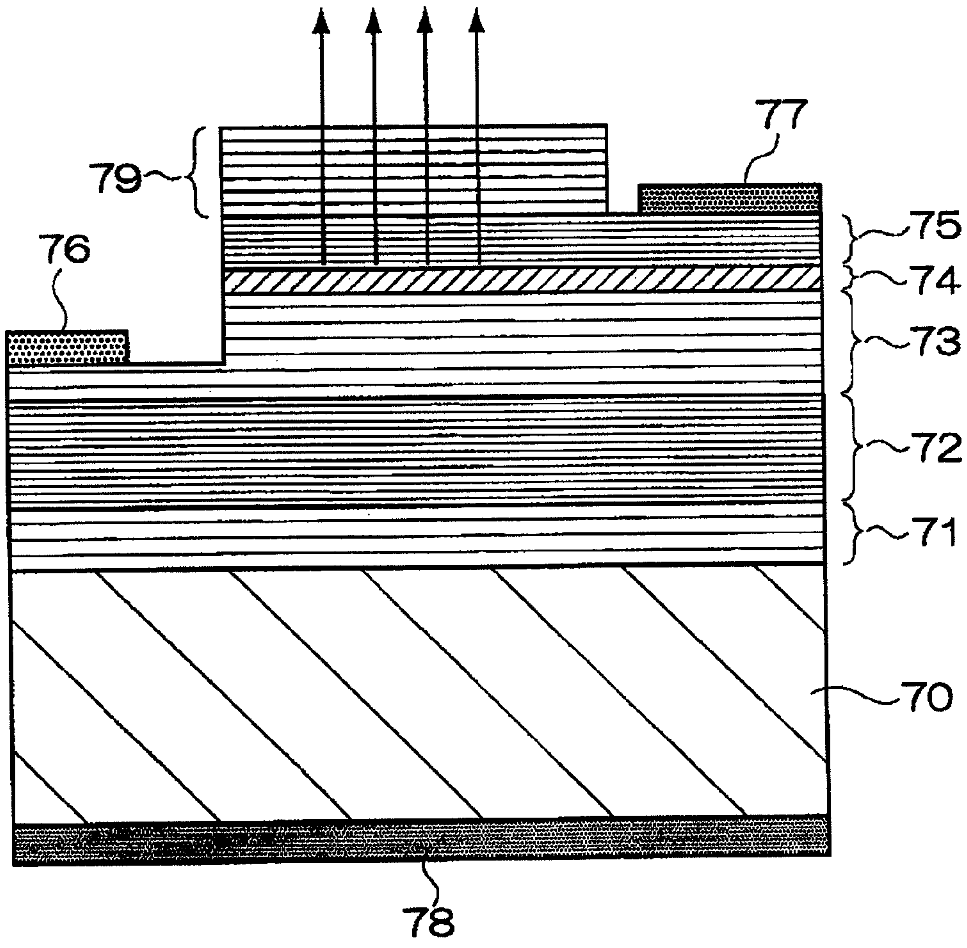
FIG. 4 is a cross-sectional schematic configuration diagram illustrating a VCSEL according to an exemplary embodiment.

FIG. 1 is a schematic configuration diagram illustrating an image forming apparatus according to an exemplary embodiment. FIG. 2 is a cross-sectional schematic configuration diagram illustrating the internal configuration of a printer head (light source head) according to an exemplary embodiment. FIG. 3 is a perspective view illustrating the appearance of a VCSEL array according to an exemplary embodiment. FIG. 4 is a cross-sectional schematic configuration diagram illustrating the appearance of a VCSEL array according to an exemplary embodiment.

An image forming apparatus 10 according to the exemplary embodiment is equipped with a photoreceptor drum 12 (electrophotographic photoreceptor) which rotates at a fixed-speed in the direction of the arrow A as shown in FIG. 1.

The periphery of the photoreceptor drum 12 is provided with, along the rotation direction of the photoreceptor drum 12, charging component 14 for charging the surface of the photoreceptor drum 12, a printer head 16 (light-source head: exposure component) for exposing the surface of the photoreceptor drum 12 which has been charged by the charging component 14 to form an electrostatic latent image on the surface of the photoreceptor drum 12, a development apparatus 18 (developing component) for developing the electrostatic latent image by a developer in order to form a toner image, a transfer roller 20 (transferring component) for transferring the toner image to a sheet 28 (recording medium), a cleaner 22 for removing the remaining toner on the photoreceptor drum 12 after transferring, and an erasing lamp 24 for diselectrifying the photoreceptor drum 12, and equalizing the electric potential.

More specifically, the surface of the photoreceptor drum 12 is charged by the charging component 14, and then light beams are emitted by the printer head 16, whereby a latent image is formed on the photoreceptor drum 12. It should be noted that the printer head 16 is connected to an actuator (not shown), and has a configuration such that the thyristor, described later, is driven by the actuator to control the laser lighting, and light beams are emitted based on image data.

To the formed latent image, a toner is supplied by the development apparatus 18 to form a toner image on the photoreceptor drum 12. The toner image on the photoreceptor drum 12 is transferred to the sheet 28 conveyed by the transfer roller 20. The toner remaining on the photoreceptor drum 12 after transferring is removed by the cleaner 22, diselectrification is performed by the erasing lamp 24, and then charging is again performed by the charging component 14. Then, the same processes are repeated.

In contrast, the sheet 28 to which the toner image has been transferred is conveyed to a fixing member 30 (fixing component) containing a pressurizing roller 30A and a heating roller 30B, and then subjected to fixing treatment. Thus, the toner image is fixed, and then a desired image is formed on the sheet 28. The sheet 28 on which the image has been formed is discharged out of an apparatus.

It should be noted that the configuration of the image forming apparatus 10 is not limited to the above-described configuration. For example, a tandem image forming apparatus may be acceptable, and another image forming apparatus is applied.

Next, the configuration of the printer head 16 will be described in detail. The printer head 16 is a self-scanning printer. As shown in FIG. 2, the printer head 16 contains a surface emitting semiconductor laser array 50 (hereinafter referred to as a VCSEL array 50), a printed circuit board 52 for supporting the VCSEL array 50 and in which a circuit (not shown) for supplying various signals for controlling the actuation of the VCSEL array 50 has been formed, and a cell fox lens array 54 (hereinafter referred to as an SLA54).

The printed circuit board 52 is disposed in a housing 56 with the attachment surface of the VCSEL array 50 being faced to the photoreceptor drum 12 and is supported by a flat spring 58.

As shown in FIG. 3, the VCSEL array 50 has a configuration such that a plurality of chips 62, in which a plurality of surface emitting semiconductor lasers 60 (hereinafter referred to as a VCSEL 60) have been arranged along the direction of the axis of the photoreceptor drum 12, are arranged in series, and light beams can be emitted at a predetermined resolution in the direction of the axis of the photoreceptor drum 12. It should be noted that, in the exemplary embodiment, 58 pieces of the chips 62 are aligned in series to thereby form the VCSEL array 50, and, in each chip 62, 128 pieces of the VCSELs 60 are arranged at intervals of 600 SPI (spots perinch).

As shown in FIG. 2, the SLA54 is supported by a SLA holder 64, and can focus light beams emitted from the each VCSEL 60 at the surface of the photoreceptor drum 12 to form an image.

Next, the VCSEL 60 will be described. The VCSEL 60 has an element structure in which a lower semiconductor multilayer film reflecting layer, a semiconductor active layer, and an upper semiconductor multilayer film reflecting layer forming a resonator with the lower multilayer film reflecting layer are successively laminated on a semiconductor substrate, for example. The VCSEL 60 has at least one thyristor serving as a switching element which selectively turns ON and OFF the light emission of the VCSEL 60 in this element structure. In other words, the VCSEL 60 has an element structure in which the layer structure of a light emitting thyristor is made into a DBR (Distributed Bragg Reflector) structure, i.e., a multilayer film reflecting layer. It should be noted that the MOCVD (metal organic chemical vapor deposition) method is applied to the crystal growth of each layer of the VCSEL 60, for example.

Specifically, as shown in FIG. 4 for example, the VCSEL 60 has a configuration such that, on a p-configuration GaAs substrate 70, a p-configuration p-AlGaAs semiconductor multilayer film reflecting layer 71 (e.g., a p-$Al_{0.2}Ga_{0.8}As$/$Al_{0.9}Ga_{0.1}As$ DBR structure layer in which 15 pairs of 41 nm thick p-$Al_{0.2}Ga_{0.8}As$ layers and 49 nm thick p-$Al_{0.9}Ga_{0.1}As$ layers are laminated); an n-configuration n-AlGaAs semiconductor multilayer film reflecting layer 72 (e.g., an n-$Al_{0.2}Ga_{0.8}As$/$Al_{0.9}Ga_{0.1}As$ DBR structure layer in which 15 pairs of 41 nm thick n-$Al_{0.2}Ga_{0.8}As$ layers and 49 nm thick n-$Al_{0.9}Ga_{0.1}As$ layers are laminated); a p-configuration p-AlGaAs semiconductor multilayer film reflecting layer 73 (e.g., a p-$Al_{0.2}Ga_{0.8}As$/$Al_{0.9}Ga_{0.1}As$ DBR structure layer in which 10 pairs of 41 nm thick p-$Al_{0.2}Ga_{0.8}As$ layers and 49 nm thick p-$Al_{0.9}Ga_{0.1}As$ layers are laminated); a non-doped i-configuration semiconductor active layer 74 (e.g., a GaAs/AlGaAs semiconductor multiple quantum well (MQW) structure in which a plurality of pairs of 8 nm thick GaAs well layers and 8 nm thick $Al_{0.2}Ga_{0.8}As$ barrier layers are laminated); and an n-configuration n-AlGaAs semiconductor multilayer film reflecting layer 75 (e.g., an n-$Al_{0.2}Ga_{0.8}As$/$Al_{0.9}Ga_{0.1}As$ DBR structure layer in which 3 pairs of 41 nm thick n-$Al_{0.2}Ga_{0.8}As$ layers and 49 nm thick n-$Al_{0.9}Ga_{0.1}As$ layers are laminated) are successively laminated.

On the light-emitting portion of the n-AlGaAs n-configuration semiconductor multilayer film reflecting layer 75 as a semiconductor multilayer film of the top layer of the light-emitting surface, a DBR structure layer, in which 7 pairs of 145 nm thick $SiO_2$ layers and 90 nm thick $TiO_2$ layers are laminated, is provided as a dielectric multilayer film 79, for example. As the dielectric multilayer film 79, a layer in which 8 pairs of $SiO_2$ layers and $Ta_2O_5$ layers are laminated, a layer in which 8 pairs of $SiO_2$ layers and $Si_3N_4$ layers are laminated, etc., may be acceptable in addition to the above.

Moreover, with respect to the p-configuration p-AlGaAs semiconductor multilayer film reflecting layer 73, one end of a portion thereof is reduced in the film thickness as compared with other portions, and, at a portion other than the film thickness-reduced portion, at least one upper layer (a non-doped i-configuration semiconductor active layer 74 or the like) is laminated. At the film thickness-reduced portion, a gate electrode 76 is provided. Moreover, a cathode electrode 77 is disposed at one end (surface of a non-light-emitting portion) of a portion of the n-configuration n-AlGaAs semiconductor multilayer film reflecting layer 75 as a semiconductor multilayer film of the top layer of the light emitting surface. Moreover, an anode electrode 78 is disposed at the rear surface (a surface where no semiconductor multilayer film reflecting layer is formed) of the p-configuration GaAs substrate 70.

In the VCSEL 60, a PNPN structure of the p-configuration p-AlGaAs semiconductor multilayer film reflecting layer 71, the n-configuration n-AlGaAs semiconductor multilayer film reflecting layer 72, the p-configuration p-AlGaAs semiconductor multilayer film reflecting layer 73, and the n-configuration n-AlGaAs semiconductor multilayer film reflecting layer 75 is equivalent to the thyristor.

The VCSEL 60 is not limited to the above-described configuration and composition. The VCSEL 60 is not limited in the configuration and composition insofar as the VCSEL 60 has a thyristor structure. The VCSEL 60 having an aspect in which the structure of the PNPN thyristor has been formed on the p-configuration GaAs substrate 70 is described. However, the aspect of the VCSEL 60 is not limited to the above. The VCSEL 60 may have an aspect in which the structure of an NPNP thyristor has been formed on the n-configuration GaAs substrate may be acceptable.

It should be noted that, as a drive circuit of the VCSEL 60 (VCSEL array 50), a drive circuit according to Japanese Patent Application Laid-Open No. 2-212170 is mentioned, for example. Specifically, a configuration is, for example, mentioned in which the LED (light emitting diode) in the drive circuit (FIG. 13 and FIG. 14) described in Japanese Patent Application Laid-Open No. 2-212170 is replaced with a VCSEL (Surface Emitting Semiconductor Laser).

In the exemplary embodiment described above, the surface emitting semiconductor laser is employed as a light source for use in the printer head 16. On the same substrate (GaAs substrate) as the substrate on which the surface emitting semiconductor laser is provided, the thyristor is provided as a switching element which selectively turns ON and OFF the light emission of the surface emitting semiconductor laser. Since the surface emitting semiconductor laser has a large light quantity as compared with LEDs, the optical writing to a photoreceptor in a short period of time is achieved. Moreover, the surface emitting semiconductor laser has a high directivity of light emission as compared with LEDs. Thus, the light utilization efficiency is high, resulting in that the electric power can be reduced, and also an optical system becomes simple, resulting in that cost reduction can be achieved. Moreover, since the thyristor is also provided, the printer head 16 functions as a switching element which selectively turns ON and OFF the light emission of the surface emitting semiconductor laser on the same substrate. Thus, a self-scanning function is also imparted. Consequently, with the printer head 16, increase in the optical writing speed is achieved at low cost and with low electric power. Moreover, with the image forming apparatus 10 to which the printer head 16 is applied, an image is formed at low cost, with low electric power, and at high speed.

Moreover, in the exemplary embodiment, an integral element in the structure of the thyristor is applied in the element structure of the surface emitting semiconductor laser. Thus, with the printer head 16, increase in the optical writing speed is achieved with a simpler configuration.

Moreover, in the exemplary embodiment, since the dielectric multilayer film 79 is formed on the light-emitting portion of the semiconductor multilayer film (n-configuration n-AlGaAs semiconductor multilayer film reflecting layer 75) of the top layer of the light emitting surface of the surface emitting semiconductor laser, both the thyristor properties and the emission properties of laser are achieved.

This is because, by providing the dielectric multilayer film, the optimal design of the thyristor and the optimal design of the surface emitting semiconductor laser can be simultaneously achieved. For example, when only the thyristor properties are taken into consideration, the thickness of the top layer (semiconductor multilayer film reflecting layer) of the light emitting surface of the surface emitting semiconductor laser is about 1.5 μm. However, even when the semiconductor multilayer film reflecting layer is formed with the thickness, reflectivity required for increasing laser properties (e.g., about 99.5%) sometimes cannot be obtained. In contrast, when the thickness of the top layer (semiconductor multilayer film reflecting layer) of the light emitting surface is increased considering only laser properties, the thyristor properties may decrease.

Thus, in the exemplary embodiment, when the semiconductor multilayer film (n-configuration e n-AlGaAs semiconductor multilayer film reflecting layer 75) to be provided on the top layer of the light emitting surface of the surface emitting semiconductor laser is formed, the thickness is determined by placing priority on the thyristor properties. Thereafter, the dielectric multilayer film 79 is formed in such a manner that reflectivity required for high laser properties can be obtained, and the thickness is adjusted. Consequently, both the thyristor properties and the emission properties of laser are achieved.

Moreover, in order to increase the film thickness of the semiconductor multilayer film reflecting layer (n-configuration n-AlGaAs semiconductor multilayer film reflecting layer 75), epitaxially growing is performed, resulting in prolonged film formation time and increased cost. In contrast, with respect to the dielectric multilayer film 79, film formation is performed at low cost, resulting in reduced cost. Moreover, the dielectric multilayer film 79 functions as a protective film by itself, which eliminates the necessity of purposely forming a protective film.

It should be noted that, in the exemplary embodiment, the aspect in which the integral element in the structure of the thyristor is applied in the element structure of the surface emitting semiconductor laser is described. However, the aspect thereof is not limited to the above, and an aspect in which the surface emitting semiconductor laser and the thyristor are separately formed on the same substrate may be acceptable.

According to the exemplary embodiment of the invention, increase in the optical writing speed is achieved at low cost and with low electric power. According to an another exemplary embodiment of the invention increase in the optical writing speed is achieved with a simpler configuration. According to an another exemplary embodiment of the invention, both the thyristor properties and the emission properties of laser are achieved. According to an another exemplary embodiment of the invention, an image is formed at low cost, with low electric power, and at a high speed.

The foregoing description of the exemplary embodiments of the present invention has been provided for the purposes of illustration and description. It is not intended to be exhaustive or to limit the invention to the precise forms disclosed. The embodiments were chosen and described in order to best explain the principles of the invention and its practical applications, thereby enabling others skilled in the art to understand the invention for various embodiments and with the various modifications as are suited to the particular use contemplated.

All publications, patent applications, and technical standards mentioned in this specification are herein incorporated by reference to the same extent as if such individual publication, patent application, or technical standard was specifically and individually indicated to be incorporated by reference. It will be obvious to those having skill in the art that many changes may be made in the above-described details of the preferred embodiments of the present invention. It is intended that the scope of the invention be defined by the following claims and their equivalents.

What is claimed is:

1. A self-scanning light source head comprising:

a substrate;

surface emitting semiconductor lasers arranged in an array on the substrate; and at least one thyristor disposed on the substrate and serving as a switching element selectively turning ON and OFF light emission of the surface emitting semiconductor lasers;

wherein the self-scanning light source head has the thyristor in the element structure of the surface emitting semiconductor laser;

wherein the surface emitting semiconductor laser has a configuration such that a lower semiconductor multilayer film reflecting layer, a semiconductor active layer, and an upper semiconductor multilayer film reflecting layer forming a resonator with the lower multilayer film reflecting layer are successively laminated on a semiconductor substrate;

wherein the lower semiconductor multilayer film reflecting layer contains a combination of a plurality of configurations of n-configuration and p-configuration semiconductor multilayer film reflecting layers; and wherein an end of a portion of a top layer of the combination of the plurality of configurations of n-configuration and p-configuration semiconductor multilayer film reflecting layers is reduced in the film thickness as compared with other portions; at least one upper layer is laminated at a portion other than the film thickness-reduced portion; and a gate electrode is disposed at the film thickness-reduced portion.

2. The self-scanning light source head according to claim 1, wherein a dielectric multilayer film is disposed on a semiconductor multilayer film of a top layer of a light emitting surface of the surface emitting semiconductor laser.

3. An image forming apparatus comprising:

an electrophotographic photoreceptor, a charging unit that charges the surface of the electrophotographic photoreceptor, an exposure unit that exposes the surface of the electrophotographic photoreceptor charged by the charging unit to form an electrostatic latent image on the surface of the electrophotographic photoreceptor, a development unit that develops the electrostatic latent image by a developer in order to form a toner image, a transfer unit that transfers the toner image to a recording medium, and a fixing unit that fixes the toner image transferred to the recording medium, the exposure unit being equipped with the light source head according to claim 1.

* * * * *